United States Patent [19]
Scott et al.

[11] Patent Number: 5,291,444
[45] Date of Patent: Mar. 1, 1994

[54] COMBINATION DRAM AND SRAM MEMORY ARRAY

[75] Inventors: David B. Scott, Plano; Hiep Van Tran, Carrollton, both of Tex.

[73] Assignee: Texas Instruments Incorporated, Dallas, Tex.

[21] Appl. No.: 812,676

[22] Filed: Dec. 23, 1991

[51] Int. Cl.⁵ .............................................. G11C 7/00
[52] U.S. Cl. .................... 365/189.05; 365/230.03; 365/230.05
[58] Field of Search ............... 365/189.05, 230.03, 365/230.05

[56] References Cited
U.S. PATENT DOCUMENTS

| | | |
|---|---|---|
| 4,905,195 | 2/1990 | Fukuda et al. .................. 365/189.05 |
| 5,016,224 | 5/1991 | Tanaka et al. .................. 365/230.03 |
| 5,029,134 | 7/1991 | Watanabe ....................... 365/189.05 |
| 5,138,577 | 8/1992 | Oh ................................. 365/189.05 |

Primary Examiner—Eugene R. LaRoche
Assistant Examiner—Son Dinh
Attorney, Agent, or Firm—Ira S. Matsil; James C. Kesterson; Richard L. Donaldson

[57] ABSTRACT

A combination dynamic random access memory (DRAM) and static random access memory (SRAM) (150) array, includes a plurality of DRAM sense amplifiers (82, 84), each coupled to at least one DRAM bitline (86), with a plurality of DRAM memory cells selectively coupled to each of the bitlines (86). The sense amplifiers (82, 84) are organized into groups, with each group of sense amplifiers (82, 84), selectively coupled to respective true and complement I/O lines (102, 104). For each pair of the true and complement I/O lines (102, 104), an SRAM latch (150) is coupled to the pair.

14 Claims, 3 Drawing Sheets

COMBINATION DRAM AND SRAM MEMORY ARRAY

TECHNICAL FIELD OF THE INVENTION

This invention relates in general to dynamic random access memories and static random access memories, and more particularly to a combination DRAM and SRAM memory array.

BACKGROUND OF THE INVENTION

Conventional dynamic random access memories (DRAMs) allow for the fast access of data using a page mode access scheme. This means that with sense amplifiers already sensed, data are read from the selected amplifier simply by toggling the common address. Although in the past this has been sufficient, several problems have arisen with respect to this approach.

First, the amount of data available in one page is not enough. For a 64 MEG DRAM, only 8K bits of data are available if an 8K refresh cycle is used. For an 8 bit output DRAM, this represents only 1K words. Second, the page mode operation is interrupted by the need to do a data refresh of the DRAM. Thus, the operating system must allow for interruption of the page mode. For those systems in which one large high density DRAM is a substantial fraction of the total memory, this becomes a bigger problem. A need is therefore arisen for a DRAM which can appear as a fully static SRAM from the point of view of the I/O pins and column and row address pins.

SUMMARY OF THE INVENTION

According to one aspect of the invention, a combination dynamic random access memory (DRAM) and static random access memory (SRAM) array includes a plurality of DRAM sense amplifiers, each coupled to at least one DRAM bitline. Each bitline has a plurality of DRAM memory cells coupled to it. The sense amplifiers are organized into groups, with each group of the sense amplifiers selectively coupled to respective true and complement I/O lines which serve each sense amplifier of the group. For each pair of true and complement I/O lines, an SRAM cell is coupled to the pair.

According to another aspect of the invention, the above true and complement I/O lines are SUB I/O lines which are multiplexed to a pair of LOCAL I/O lines through a plurality of select transistors. Because the SUB I/O lines form an isolated node in the circuit that is capable of storing a bit, a latch can be connected to the pair of SUB I/O lines to retain their state. The floating node on the SUB I/O line exists when pass gates to the sense amplifiers are turned off.

A principal technical advantage of the array architecture is that it acts as an SRAM with a DRAM hidden behind it. For a 64 MEG DRAM with 120 cells per bitline, a 32K SRAM is provided which can be accessed by toggling the block and column addresses. The 32K SRAM is made totally independent of the DRAM by keeping the pass gates of the sense amplifiers turned off. This means that the SRAM can receive and transmit data while the DRAM independently goes through a refresh cycle. A further technical advantage is that a much larger page is available for fast access. Also, there is no need to interrupt the flow of data due to refresh requirements. The hidden refresh cycle may now be truly hidden.

The SRAM can be thought of as, in effect, a cache with a 1K bit parallel read and write mode. Thus, the memory becomes segmented between SRAM and DRAM portions with an SRAM bit directly supported by 2K bits of DRAM. A further advantage of this scheme is that the conventional redundancy of extra rows for block means that row and single bit failures in each block that support the SRAM can be repaired.

BRIEF DESCRIPTION OF THE DRAWINGS

Further aspects of the invention and their advantages may be discerned with reference to the following drawings, in which like characters denote like parts, and in which.

DETAILED DESCRIPTION OF THE INVENTION

Figure 1:
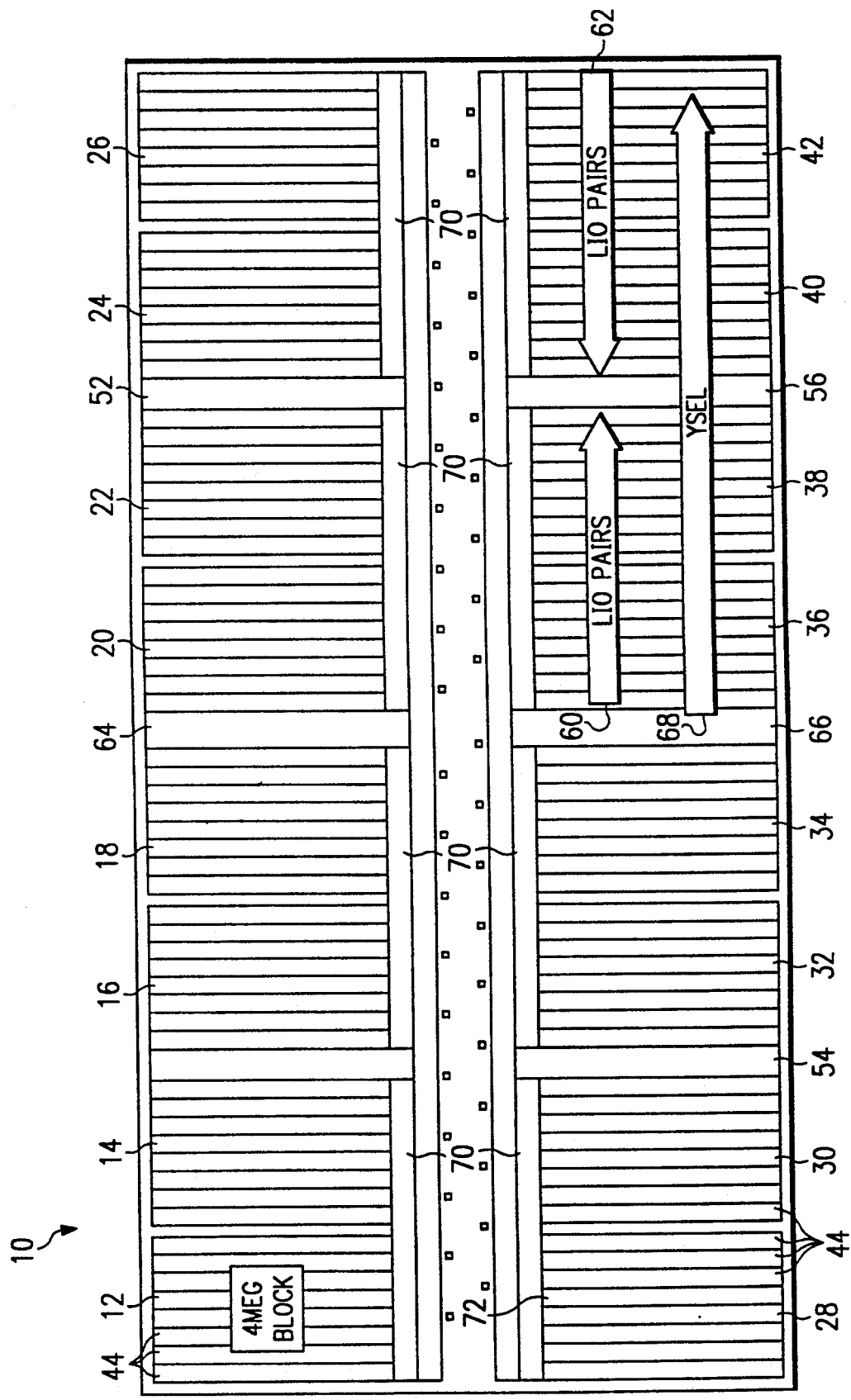
FIG. 1 is a plan view of a combination DRAM and SRAM device according to the invention, schematically showing its high-level architecture.

FIG. 1 is a schematic high level architectural plan view of a hierarchical multi-dataline (HMD) memory chip including both dynamic random access memory and static random access memory according to the invention. The chip is indicated generally at 10. The illustrated chip 10 contains 64 megabits of dynamic random access memory and an associated 32K bits of static random access memory. The memory is organized into sixteen four-megabit blocks 12–42. Each of the memory blocks 12–42 includes eight 512K bit arrays 44 of DRM cells.

The chip 10 is provided with four wide data path circuit blocks 50, 52, 54 and 56. Wide data path circuit 50 is provided for memory blocks 12–18, wide data path circuit 52 is provided for memory blocks 20–26, wide data path circuit 54 is provided for memory blocks 28–34, and wide data path circuit 56 is provided for memory blocks 36–42. A plurality of true and complement LOCAL I/O (LIO) lines, indicated schematically by arrows 60 and 62, are connected from blocks of the memory cells to an associated wide datapath circuit 56. For example, a set of LOCAL I/O line pairs 60 connects the blocks 36 and 38 to the wide data path circuit 56, while a set of LOCAL I/O pairs 62 performs the same function for blocks 40 and 42.

A first Y decoder block 64 is provided for the eight top blocks 12–26, while a Y decoder block 66 is provided for the bottom eight blocks 28–42. For the group of four blocks on one side of a Y decoder, a set of Y select lines, here indicated schematically by arrow 68, connects these blocks to its respective Y decoder block. For example, the set of Y select lines 68 connects blocks 36–42 to the Y decoder block 66. Similar sets (not shown) are provided for blocks 28–34, 20–26 and 12–18. Each pair of four megabyte blocks 12–14, 16–18, 20–22, 24–26, 28–30, 32–34, 36–38 and 40–42 is provided with a row decoder section 70.

The architecture of the illustrated chip is such that, as measured in a vertical dimension in FIG. 1, there are 8K cells, 4K bitlines and 2K sense amplifiers. In a horizontal direction, there are 8K cells, 16K wordlines and sixty-eight sense amplifier banks. The sense amplifier banks are illustrated in FIG. 1 by the boundaries between adjoining 512K memory cell arrays 44. One such bank of sense amplifiers is for example, shown at 72.

Figure 2:
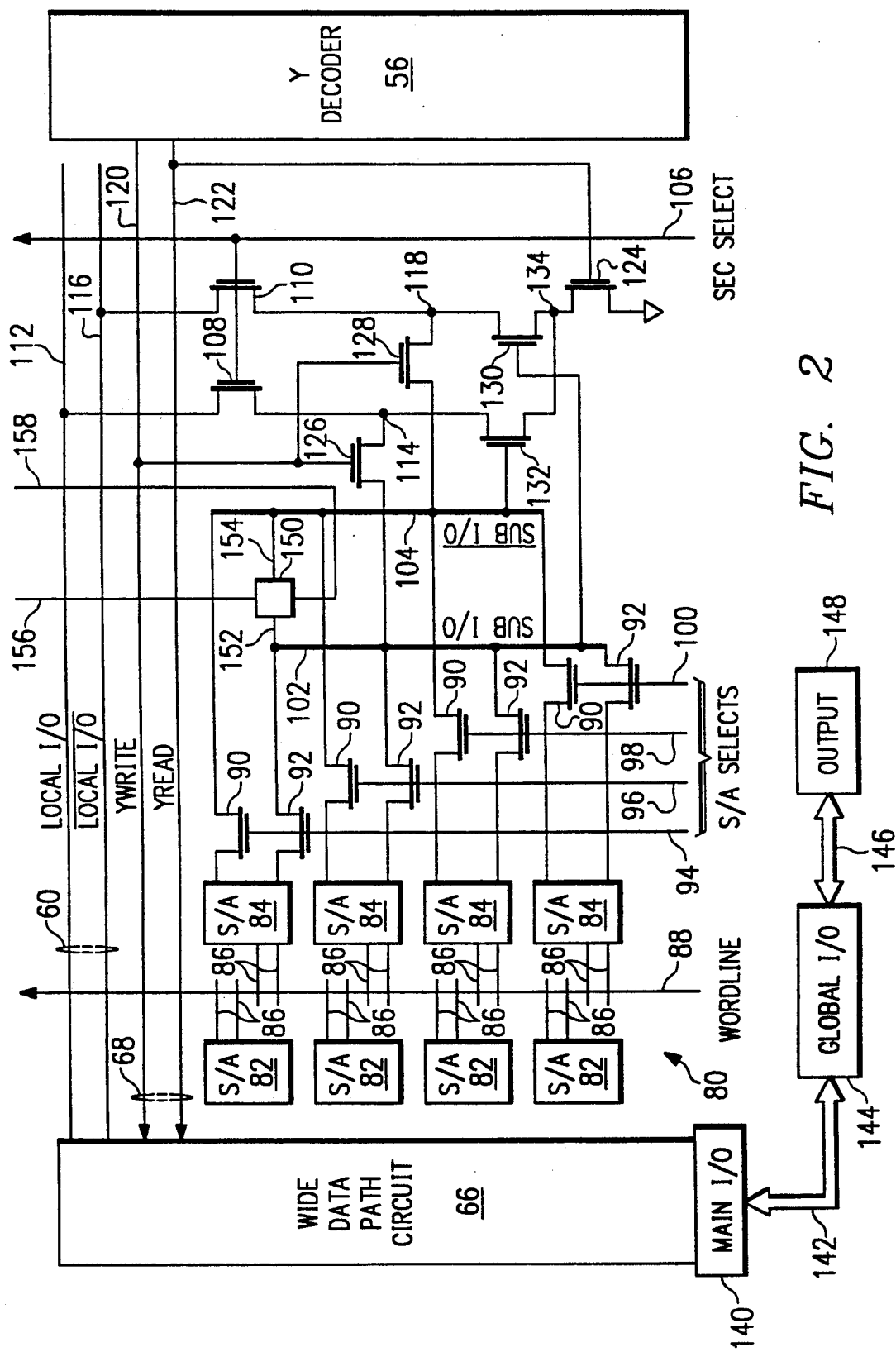
FIG. 2 is a schematic electrical circuit diagram showing the architecture of a section of the memory device.

Turning now to FIG. 2, a section 80 of sense amplifiers is shown, comprising four sense amplifiers 82 and four sense amplifiers 84. The sense amplifiers 82 and 84 may, for example, make up eight sense amplifiers of the 2K sense amplifier bank 72 shown in FIG. 1. Each sense amplifier is connected to a pair of bitline halves 86. The bitline halves 86 intersect with each of a plurality of wordlines 88, only one being shown in FIG. 2 for the purpose of clarity. At the intersection of wordline 88 with each of the bitline halves 86, a dynamic random access memory cell (not shown) is formed that includes a pass transistor having a gate connected to the wordline 88 and a current path connecting one of the bitline halves to a respective capacitor.

For each sense amplifier 84, a pair of sense amplifier select or pass transistors 90 and 92 are provided. A plurality of sense amplifier select lines 94–100 are connected to the gates of respective pairs of the sense amplifier select transistors 90 and 92. The current paths of each of the transistors 90 connect the respective sense amplifier to a SUB I/O line 102, while each sense amplifier select transistor 92 has a current path which is operable to connect a respective sense amplifier to a complement $\overline{\text{SUB I/O}}$ line 104.

A section select line 106 controls the gates of a pair of I/O access transistors 108 and 110. A LOCAL I/O line 112 is connected through the current path of section select transistor 108 to a node 114. A LOCAL I/O line 116 is connected through the current path of I/O access transistor 110 to a node 118. LOCAL I/O line 112 and $\overline{\text{LOCAL I/O}}$ line 116 form a LOCAL I/O line pair, such as one of the LOCAL I/O pairs 60 shown in FIG. 1. The LOCAL I/O pair 60 is connected to a wide data path circuit, such as circuit 66 as shown in FIG. 1.

The wordlines 88 (one shown) are connected to one of the row decoder banks 70 shown in FIG. 1.

One pair of the Y select lines 68 is connected to a Y decoder bank, such as decoder bank 56 shown in FIG. 1, and consists of a YWRITE line 120 and a YREAD line 122. The YREAD line 122 is connected to the gate of a transistor 124. The YWRITE line 120 is connected to the gates of WRITE transistors 126 and 128.

The SUB I/O line 102 is connected to the gate of a transistor 130, while the $\overline{\text{SUB I/O}}$ line 104 is connected to the gate of a transistor 132. The current path of transistor 132 connects node 114 to a node 134, while the current path of transistor 130 connects node 118 to node 134. The gate of transistor 130 is connected to SUB I/O line 102, while the gate of transistor 132 is connected to $\overline{\text{SUB-I/O}}$ line 104.

Information is read from the SUB I/O line pair 102 and 104 by the selective energization of transistors 132 and 130, which in turn will selectively pull down the LOCAL I/O lines 112 and 116. Data are written to the SUB I/O line pair 102 and 104 through the current paths of transistors 126 and 108 (in the case of SUB I/O line 102) transistors 128 and 110 (in the case of $\overline{\text{SUB I/O}}$ line 104. In combination with other transistors 108, 110, 126 and 128, these transistors operate to multiplex a plurality of SUB I/O line pairs 102 and 104 to a single LOCAL I/O line pair 60.

The wide data path circuit 66 is coupled to a main I/O block 140. A data path 142 couples the main I/O block 142 to a global I/O block 144. A further data path connects the global I/O block 146 to output circuitry 148.

According to the invention, an SRAM latch 150 has a first input 152 connected to SUB I/O line 102 and a second input 154 connected to $\overline{\text{SUB I/O}}$ line 104. Latch 150 also has a pair of latch enable control lines 156 and 158. If the pass transistors 90 and 92 are all turned off, the SUB I/O line pair 102 and 104 will be floating nodes, allowing for the storage of a bit of data. The SRAM latch 150 is inserted between the SUB I/O lines 102 and 104 in order to latch the bit of data stored on lines 102 and 104. In conjunction with its associated pass transistors, latch 150 acts as an SRAM memory cell.

Figure 3:
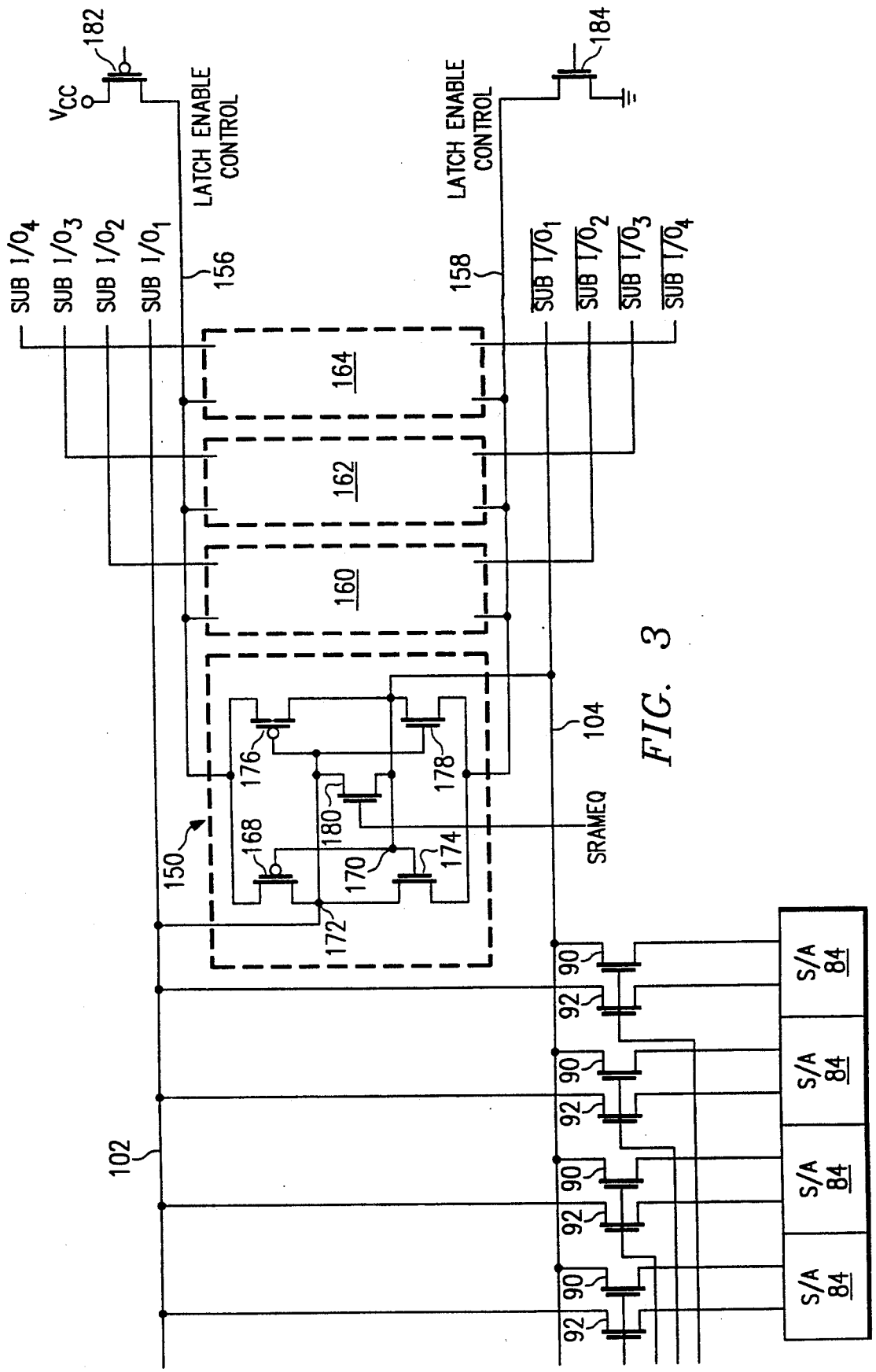
FIG. 3 is a schematic electrical circuit diagram of a group of SRAM cells connected to a single pair of latch enable control lines.

FIG. 3 is a more detailed electrical schematic diagram of SRAM latch 150 and organizationally related SRAM latches 160, 162 and 164. SRAM latches 150, 160, 162 and 164 are indicated by respective rectangular enclosures. Only the components of latch 150 are illustrated; latches 160–164 are preferably similar. In latch 150, a p-channel field effect transistor 168 has a gate connected to a node 170, a source connected to the latch enable control line 156, and a drain connected to a node 172. The node 172 is connected to SUB I/O line 102. An n-channel field effect transistor 174 has a drain connected to the node 172, a source connected to latch enable control line 158, and a gate connected to the node 170. A p-channel field effect transistor 176 has a source connected to the latch enable control line 156, a drain connected to the node 170 and a gate connected to node 172. An n-channel field effect transistor 178 has a drain connected to the node 170, a gate connected to the node 172 and a source connected to the latch enable control line 158. Node 170 is connected to the $\overline{\text{SUB I/O}}$ line 104.

An n-channel field effect transistor 180 has a current path which selectively connects node 172 to 170 and a gate connected to a source of a signal SRAMEQ. When this signal is activated, the nodes 172 and 170 will equalize to each other and will no longer store a bit of data.

The latch 150 latches the bit of data present on the SUB I/O line pair SUB I/O$_1$ and $\overline{\text{SUB I/O}}_1$. In a like manner, latch 160 is capable of latching a data bit on SUB I/O$_2$, $\overline{\text{SUB I/O}}_2$, latch 162 is operable to latch a data bit on SUB I/O$_3$, $\overline{\text{SUB I/O}}_3$, and latch 164 is operable to latch a data bit on SUB I/O$_4$, $\overline{\text{SUB I/O}}_4$. Cells 150, 160, 162 and 164 are all controlled by latch enable control lines 156 and 158. Other arrangements seeking to control a plurality of SRAM latches with a single pair of latch enable control lines 156, 158 can be thought of. In the illustrated embodiment, a p-channel field effect transistor 182 has a current path selectively connecting a high voltage supply with line 156. Similarly, an n-channel field effect transistor 184 has a current path which selectively connects latch enable control line 158 to ground.

While a five-transistor SRAM latch 150 has been illustrated, other latches can be employed instead.

In operation, when a bit of data is desired to be written to the SRAM latch 150, a selected one of the sense amplifiers 84 is connected to the SUB I/O lines 102, 104 by activation of a respective pair of the pass transistors 90 and 92. The transistors of the SRAM latch 150 should be sized so as to be easily toggled by the sense amplifier and not to overpower its operation. When the sense amplifiers are engaged in sensing the states of the DRAM cells connected to their respective bitlines halves, the select transistors 90 and 92 are deactivated, thus isolating the sense amplifiers 84 from the SUB I/O lines 102 and 104. In this way, both DRAM and SRAM operation may be obtained in the same circuit.

The architecture of the invention can be thought of a high density SRAM, with every SRAM bit supported by its own small DRAM. The invention takes advantage of the wide data path architecture of the disclosed DRAM array to embed an SRAM by means of latching the isolated SUB I/O lines 102 and 104 in the data path.

All the latches in a section could be activated by applying a signal to the gates of latch enable control transistors 182 and 184. While DC conditions exist on the latch, data may be statically stored. In addition, this data can either be read from one of the four sense amplifiers 84 or be written into one of the four sense amplifiers 84 with appropriate manipulation of the pass transistors 90 and 92. One technical advantage of the invention is that for a 64 MEG DRAM with 128 cells per bitline, a 32K SRAM exists which may be accessed by toggling the block and column addresses. Also, by keeping the pass gates 90 and 92 to the sense amplifiers 84 all turned off, the 32K SRAM is totally independent of the DRAM. This means that the SRAM can receive and transmit data while the DRAM goes independently through a refresh cycle.

The architecture of the invention allows for the following further advantages. A much larger page is available for fast access. There is no need to intercept the flow of data due to refresh requirements. The conventional "hit and refresh" cycle now may be truly hidden. Further, the SRAM becomes in effect a cache with 1K bit parallel read and write mode. Thus, the memory becomes segmented between SRAM and DRAM, with each SRAM bit directly supported by 2K bits of DRAM.

Another advantage of this scheme is that the conventional redundancy of extra rows per block means that row and single-bit failures in each block that support the SRAM can be repaired. For column redundancy, the SRAM column with all its associated DRAM bits must be replaced.

The number of sense amplifiers 84 per LOCAL I/O line pair is flexible. In addition, the parallel read and write between the DRAM and SRAM sections of the memory has the data width limited by power and clocking considerations. There is, however, no other fundamental reason why a 32K bit parallel read or write could not be done if all of the DRAM sense amplifiers could be latched.

In summary, a novel memory architecture has been shown and described that takes advantage of a set of isolated nodes in the memory data path to insert SRAM cells to latch data resident on those nodes.

While an illustrated embodiment of the invention has been described in the above-detailed description, the invention is not limited thereto but only the scope and spirit of the appended claims.

What is claimed is:

1. A combination dynamic random access memory (DRAM) and static random access memory (SRAM) array, comprising:
    a plurality of DRAM sense amplifiers each coupled to at least one DRAM bit line, a plurality of DRAM memory cells selectively coupled to each said bit line;
    said sense amplifiers organized into groups, each group of sense amplifiers selectively coupled to respective true and complement I/O lines, wherein said true and complement I/O lines comprise a true and a complement SUB I/O line, a respective higher-order true I/O line and higher-order complement I/O line provided for groups of said SUB I/O lines and said complementary SUB I/O lines, each group of true and complement SUB I/O lines respectively multiplexed to a true and a complement higher-order I/O line; and
    for each pair of true and complement I/O lines, an SRAM cell coupled to said pair.

2. The array of claim 1, wherein each group of sense amplifiers consists of four sense amplifiers.

3. The array of claim 1, and further comprising, for each sense amplifier, a pair of sense amplifier select transistors having current paths for selectively coupling respective ones of said sense amplifiers to said true and complement SUB I/O lines and for selectively isolating said static RAM cell from said sense amplifiers.

4. A hierarchical multi-dataline memory device, comprising:
    a plurality of memory cell blocks formed at a face of a semiconductor chip, each block including a plurality of memory arrays, each array comprising a plurality of rows and columns with dynamic random access memory cells formed at intersections of said rows and columns;
    for each of a plurality of groups of memory cell blocks, a wide data path circuit, a plurality of true and complement LOCAL I/O lines multiplexed by said wide data path circuit to a main I/O circuit;
    each of said memory arrays organized into sections, a section select line provided for each section in said memory array;
    each section having a plurality of sense amplifiers and at least one pair of true and complement SUB I/O lines, select gates having control electrodes coupled to said section select lines and current paths selectively coupling said SUB I/O lines to said LOCAL I/O lines;
    for each sense amplifier in said plurality of sense amplifiers, a sense amplifier select line, a plurality of sense amplifier select transistors, a group of said sense amplifiers coupled to said SUB I/O lines through current paths of said sense amplifier select transistors; and
    for each pair of SUB I/O lines, a static random access memory latch coupled thereto.

5. The device of claim 4, and further comprising, for each memory array, first and second latch enable control lines, a first latch enable control transistor having a current path for selectively coupling a first voltage to said first latch enable control line, a second latch enable control transistor having a current path for selectively coupling said second latch enable control line to a second voltage substantially lower than said first voltage, said array having a plurality of static RAM cells, each static RAM latch in said array coupled to said first and second latch enable control lines.

6. A memory array, comprising:
    a plurality of sense amplifiers each coupled to a plurality of memory cells for sensing the states thereof, said sense amplifiers organized into groups; and
    for each group of sense amplifiers, a true I/O line and a complement I/O line, a memory latch coupled to said true I/O line and said complement I/O line for latching the state said true and complement I/O lines;
    wherein said true and complement I/O lines consist of SUB I/O line pairs, a plurality of said SUB I/O line pairs organized into groups, each group corresponding to a higher-order true and complement line pair, circuitry for selectively coupling one of said SUB I/O line pairs to said higher-order line pair, said circuitry operable to isolate said SUB I/O line pairs from said higher-order line pair.

7. The memory array of claim 6, wherein said memory latch coupled to said true and complement I/O lines comprises a static random access memory latch.

8. The memory array of claim 6, and further comprising a plurality of select gates for selectively coupling said group of sense amplifiers to said true I/O line and said complement I/O line, said select gates operable to isolate said true and said complement I/O lines from said sense amplifiers.

9. A combination dynamic random access memory (DRAM) and static random access memory (SRAM), comprising:
   a plurality of sense amplifiers each coupled to a plurality of DRAM cells for sensing the states thereof;
   for each group of sense amplifiers, a true I/O line and a complement I/O line, circuitry for selectively coupling one or none of said sense amplifiers to said true and complement I/O lines, an SRAM latch coupled between said true I/O line and said complement I/O line for latching the state thereof; and
   for each sense amplifier, a pair of sense amplifier select transistors having current paths for selectively coupling respective ones of said sense amplifiers to said true and complement I/O lines and for selectively isolating said SRAM latch from said sense amplifiers.

10. A method for latching the state of a true SUB I/O line and a complement SUB I/O line, comprising the steps of:
   isolating the true and complement SUB I/O lines from a plurality of sense amplifiers selectively coupled thereto;
   isolating the true and complement SUB I/O lines from a higher-order true and complement I/O line; and
   latching the true and complement SUB I/O lines with a latch coupled between said true and complement I/O lines.

11. The array of claim 9 and further comprising for each of a plurality of groups of said SRAM latches, latch enable control circuitry for enabling the latching of data by said SRAM latches.

12. A combination dynamic random access memory (DRAM) and static random access memory (SRAM) array, comprising:
   a plurality of DRAM sense amplifiers each coupled to at least one DRAM bit line, a plurality of DRAM memory cells selectively coupled to each said bit line;
   said sense amplifiers organized into groups, each group of sense amplifiers selectively coupled to respective true and complement I/O lines;
   for each sense amplifier, a pair of sense amplifier select transistors having current paths for selectively coupling respective ones of said sense amplifiers to said true and complement SUB I/O lines and for selectively isolating said static RAM cell from said sense amplifiers; and
   for each pair of true and complement I/O lines, an SRAM cell coupled to said pair.

13. The array of claim 12, wherein said true and complement I/O lines comprise a true and a complement SUB I/O line, a respective higher-order true I/O line and higher-order complement I/O line provided for groups of said SUB I/O lines and said complementary SUB I/O lines, each group of true and complement SUB I/O lines respectively multiplexed to a true and a complement higher-order I/O line.

14. The array of claim 12, wherein each group of sense amplifiers consists of four sense amplifiers.

* * * * *